(12) United States Patent
Liang et al.

(10) Patent No.: US 7,193,847 B2
(45) Date of Patent: Mar. 20, 2007

(54) BLADE SERVER SYSTEM

(75) Inventors: Yuan-Chen Liang, Tao Yuan Shien (TW); Yung-Lung Liu, Phan Chiao (TW); Hsueh-Chin Lu, Tao Yuan Shien (TW); Chao-Jung Chen, Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 27 days.

(21) Appl. No.: 11/094,179

(22) Filed: Mar. 31, 2005

(65) Prior Publication Data

US 2006/0221579 A1   Oct. 5, 2006

(51) Int. Cl.
  *G06F 1/20* (2006.01)
  *G06F 1/26* (2006.01)

(52) U.S. Cl. .................. 361/687; 713/330; 16/229; 361/690

(58) Field of Classification Search ................ 710/303; 713/330; 415/213.1; 16/229, 392; 312/223.1–223.2; 361/690, 679–687, 724–727
See application file for complete search history.

(56) References Cited

U.S. PATENT DOCUMENTS 6,771,499 B2   8/2004   Crippen et al.
2003/0105984 A1 *  6/2003  Masayuama et al. ........ 713/330
2004/0062002 A1 *  4/2004  Barringer et al. ........... 361/687
2005/0047079 A1 *  3/2005  Gasbarro et al. ........... 361/686
2005/0195075 A1 *  9/2005  McGraw et al. ............ 340/500

\* cited by examiner

*Primary Examiner*—Hung Van Duong
(74) *Attorney, Agent, or Firm*—Rabin & Berdo, PC

(57) ABSTRACT

A blade server system is described. The blade server system includes a main chassis, a rear module chassis and a mid-plane. The main chassis is formed with slots into which a plurality of sever blades are slidably inserted from the front end of the main chassis. The rear module chassis is removably mounted to the rear end of the main chassis, and divided into plural partitions for housing different component modules. The mid-plane is mounted to an end of the rear module chassis, and includes a first face and an opposite second face. The first face has plural connectors electrically connected to the server blades and the second face has plural connectors electrically connected to the component modules. Therefore, when maintenance is needed for the mid-plane, the service engineer only needs to withdraw the entire rear module chassis as a whole, without the need to remove the individual component modules.

15 Claims, 5 Drawing Sheets

BLADE SERVER SYSTEM

CROSS-REFERENCE TO RELATED APPLICATION

Not Applicable

STATEMENT REGARDING FEDERALLY SPONSORED RESEARCH OF DEVELOPMENT

Not Applicable

BACKGROND OF THE INVENTION

1. Field of the Invention

The present invention relates to a blade server system, and more particularly, to a blade server system with a detachable rear module chassis for housing component modules and mounting a mid-plane to allow easy maintenance.

2. Description of the Related Art

The present invention pertains to computers and other information processing systems and, more particularly, to a blade server system.

Conventional blade server systems include a main chassis into which a plurality of "sever blades" is slidablely insert 22d into slots in the front of the main chassis. The server blades are usually hot pluggable, they can be removed from the main chassis without the need to shut down the chassis and all its components. Each server blade includes the majority of the components of a conventional server, minus certain components that are included in the main chassis and are shared among all the server blades in the chassis.

These shared components include power supplies, network switches and air moving devices such as fans and blowers. The shared components are usually presented as a management module, switch modules, power supply modules, Ethernet modules, fans, which are pluggable to connectors provided on a mid-plane. An example of such an arrangement is disclosed in U.S. Pat. No. 6,771,499, depicted in FIG. 1.

When maintenance is needed for the mid-plane in the prior art, the service engineer usually needs to remove all of the modules prior to accessing to the mid-plane. Likewise, when maintenance is performing on one of the modules, other modules may obstruct the removal of a single module, such that the neighboring modules may need to be removed in order to properly remove the module intended to be maintained.

Accordingly, it is relatively time-consuming to repair the mid-plane or the modules due to the inconvenient process of removing and re-assembling the various components.

SUMMARY OF THE INVENTION

Briefly, the invention discloses a blade server system having a rear module chassis for housing various component modules shared among all the server blades in the chassis.

According to one aspect of the present invention, the rear module chassis includes several partitions for housing different component modules, such that a single component module may be easily removed from the mid-plane in case of maintenance without the need to remove other component modules.

According to another aspect of the present invention, the mid-plane is mounted to the rear module chassis, such that upon removal of the rear module chassis as a whole, the mid-plane is removed from the main chassis simultaneously to allow easy maintenance, without the need to remove the component modules one by one.

BRIEF DESCRIPTION OF THE DRAWINGS

The foregoing aspects and many of the attendant advantages of the present invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
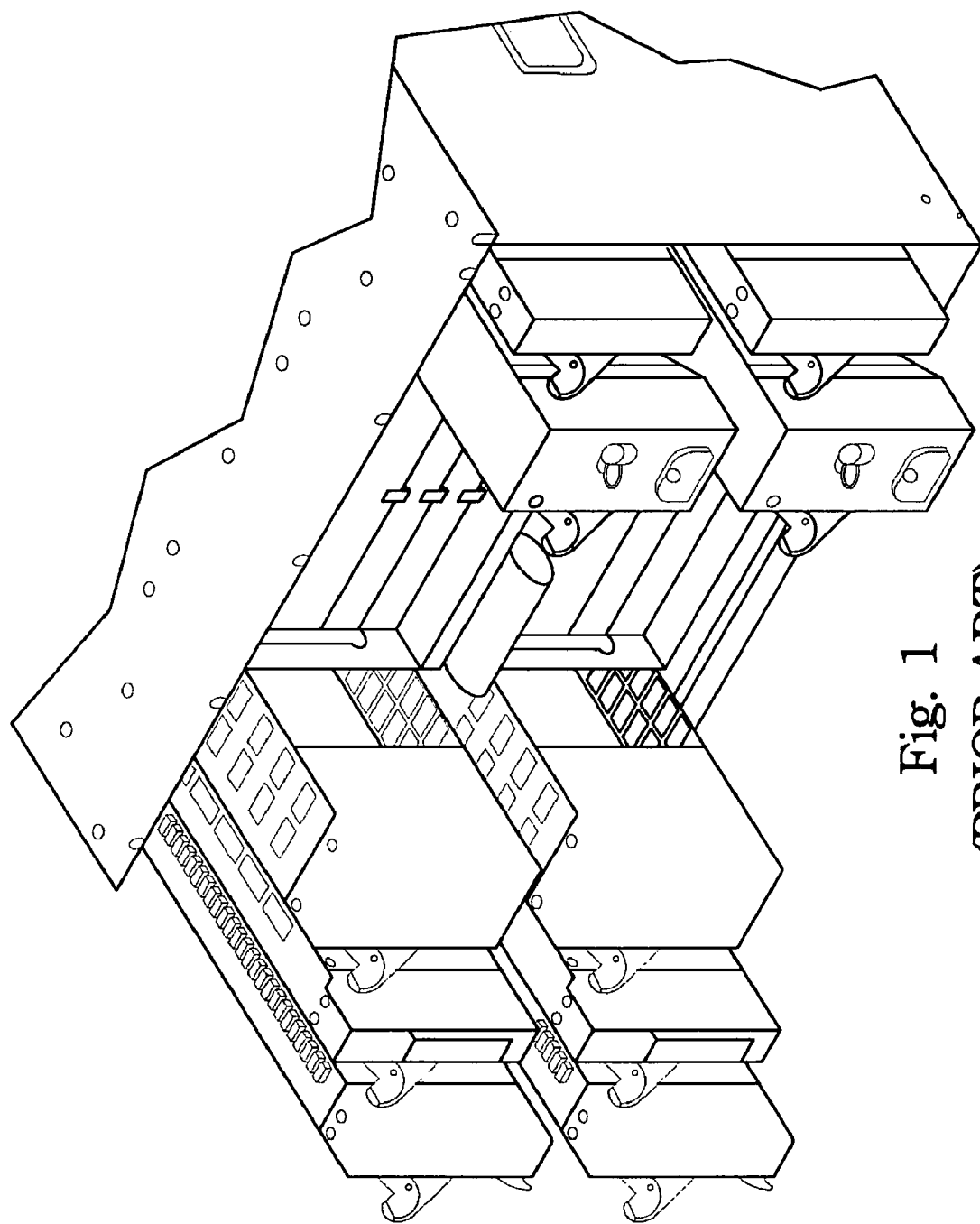
FIG. 1 depicts a perspective view of the rear end of a prior blade server system, where all the component modules are independently mounted to a mid-plane.
Figure 2:
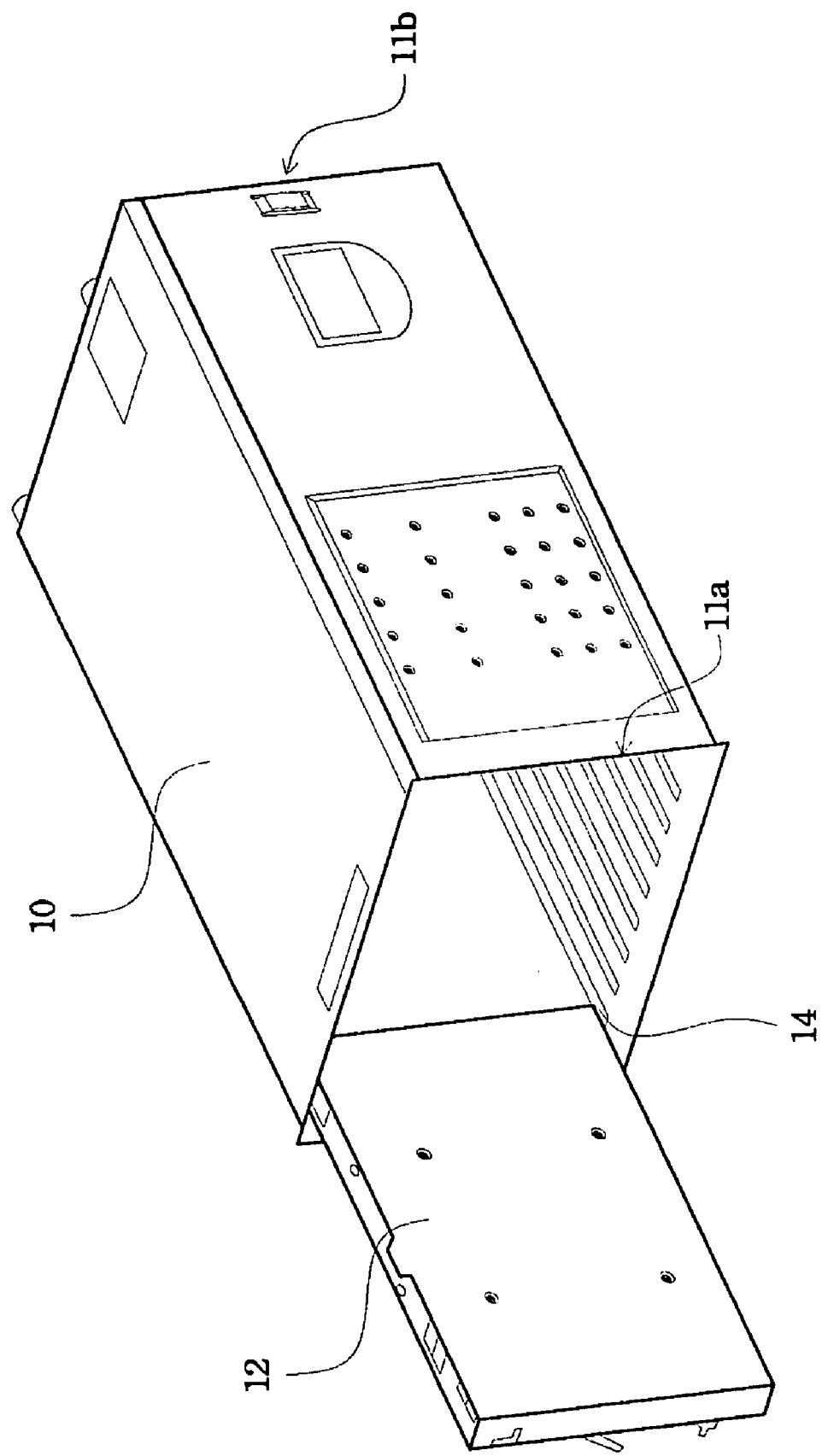
FIG. 2 depicts a perspective view of the overall appearance of the blade server system according to the present invention, where a blade server is yet to be slid into the main chassis.

FIG. 2 is a perspective view of the overall appearance of the blade server system according to the present invention. Referring to this figure, a main chassis 10 houses all the components of the server blade system. The main chassis 10 has a front end 11a and an opposite rear end 11b. Only one blade 12 is depicted in FIG. 2 to slide into the main chassis 10 through its front end 11a for clear illustration. There, however, may be up to fourteen server blades or processor blades that are hot pluggable into the slots 14 through the front end of the main chassis 10. The term "server blade" or "processor blade", or simply "blade" is used throughout the specification and claims, but it should be understood that these terms are not limited to blades that only perform "processor" or "server" functions, but also include blades that perform other functions, such as storage blades, which typically include hard disk drives and whose primary function is data storage.

Figure 3:
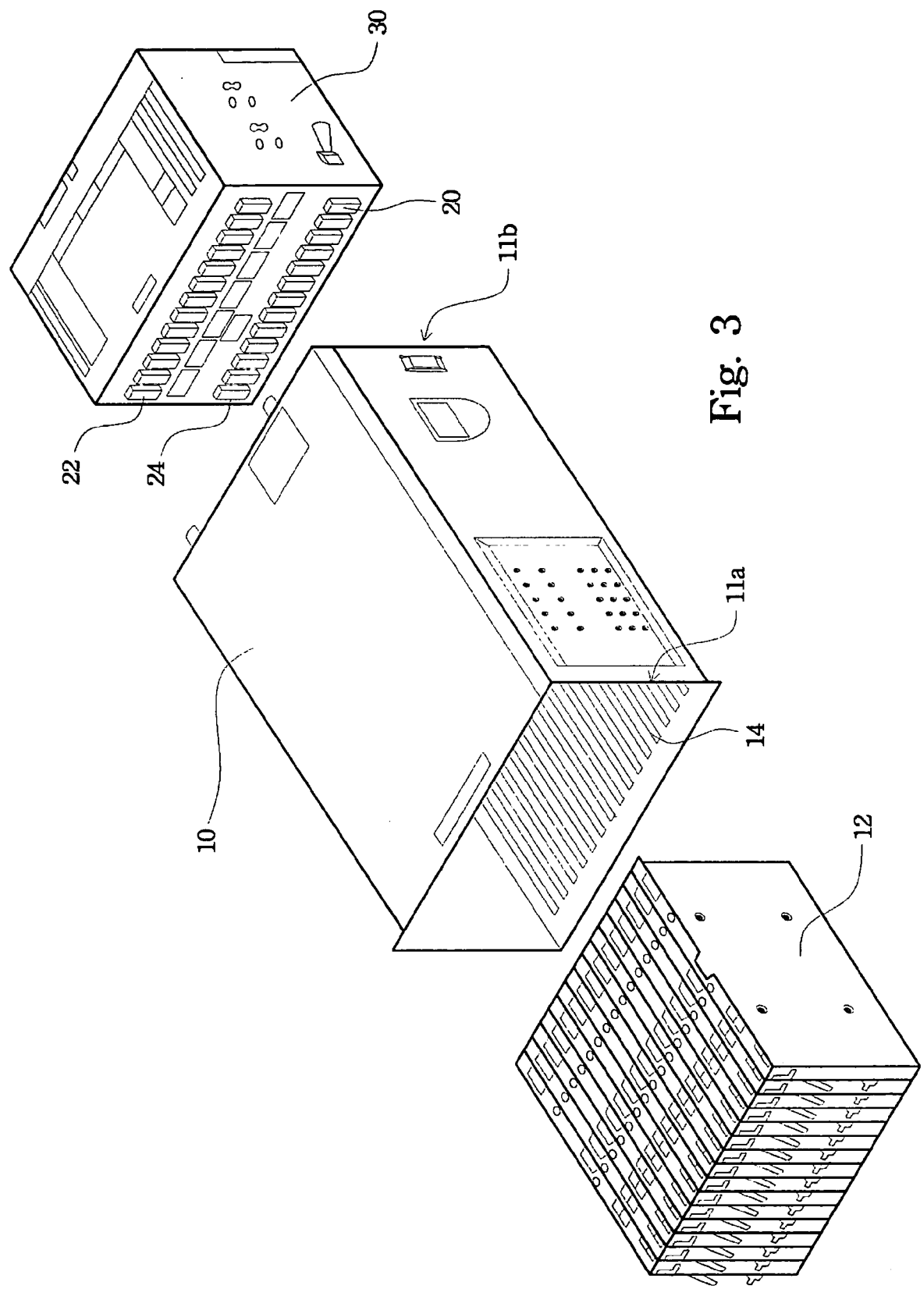
FIG. 3 depicts a perspective, exploded view of the blade server system according to this invention.
Figure 4:
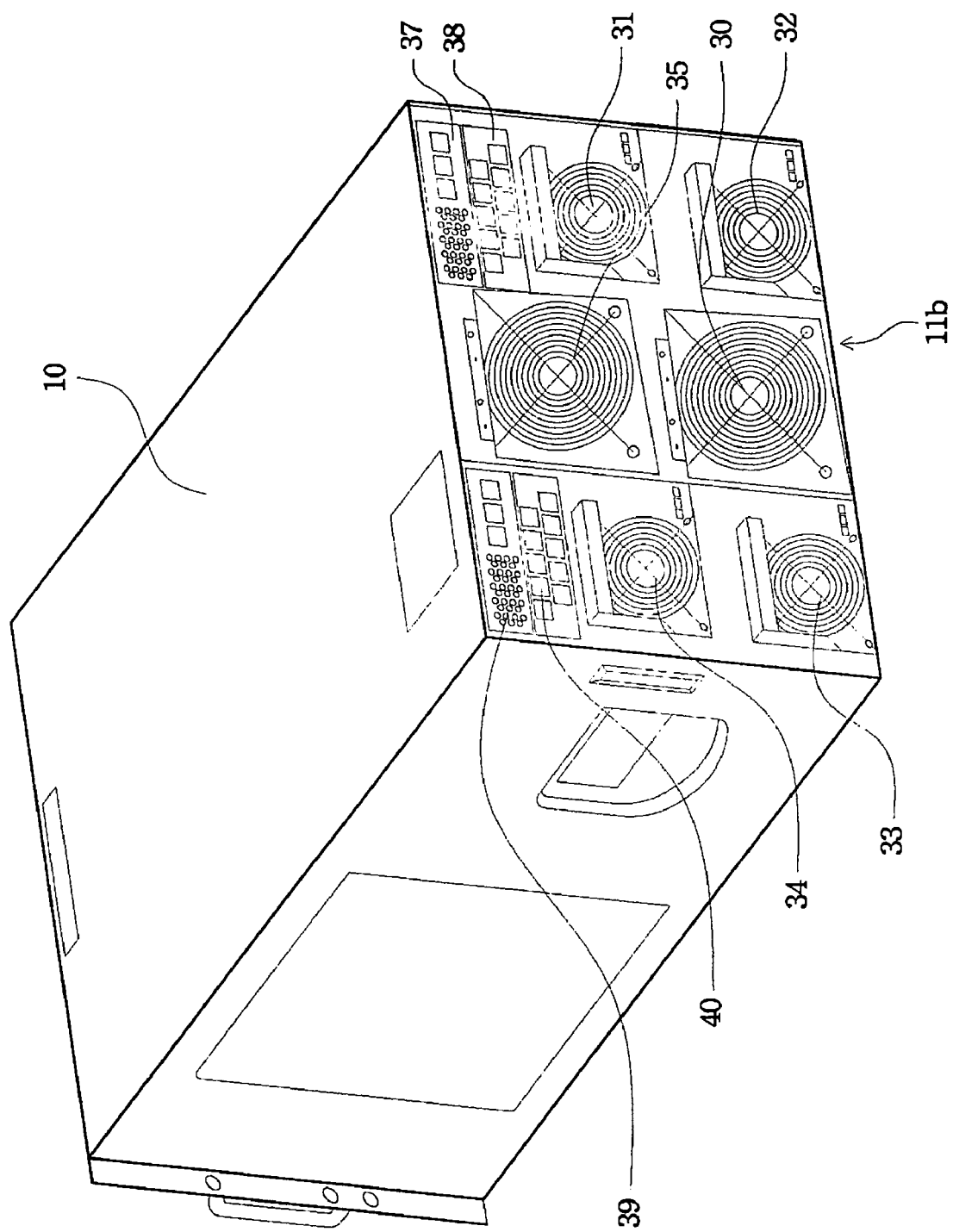
FIG. 4 depicts a perspective view of the rear end of the blade server system according to the present invention, where the rear module chassis is mounted to the main chassis.
Figure 5:
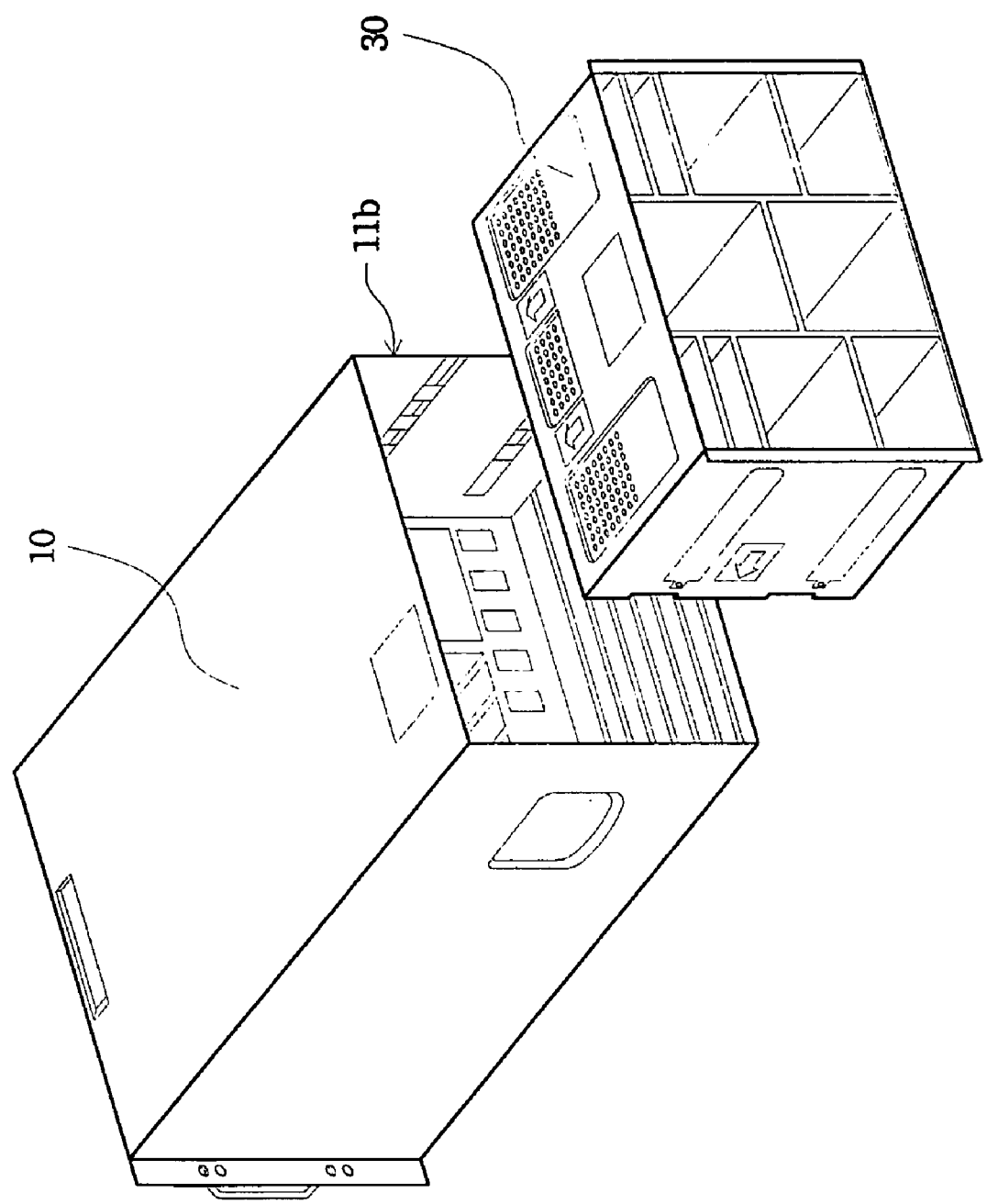
FIG. 5 depicts a perspective view of the rear end of the blade server system according to the present invention, where the rear module chassis is removed from the main chassis and the component modules are removed for clear illustration.

FIG. 3 is a perspective, exploded view of the blade server system according to this invention. FIGS. 4 and 5 are perspective views of the rear end of the blade server system according to the present invention. As shown in FIGS. 3 to 5, a rear module chassis 30 is mounted to and removed from the rear end 11b of the main chassis 10, respectively. The rear module chassis 30 is provided to house various hot pluggable component modules 31~40 for control, switching, power, communication and cooling. Such component modules are usually referred to as the management module, switch modules 37, 39, power supply modules 31~34, fiber pass through blade 38, 40, Ethernet modules, fan module 30, 35, and pluggable to connectors (not shown) provided on a mid-plane circuit board 20. The component modules 31~40 in FIG. 5 are removed to clearly show the construction of the rear module chassis 30. The rear module chassis 30, in this embodiment, is slidablely inserted into the rear end of the main chassis 10. The rear module chassis 30 may alternately be mounted to the main chassis 10 by means of other locking means, such as locks and latches.

As best shown in FIG. 3, the mid-plane circuit board 20 is positioned approximately in the middle of the main chassis 10 after the rear module chassis 30 is inserted through the rear end of the main chassis 10. The mid-plane circuit board 20 may include a single row of connectors to accommodate the "gold fingers" provided to the server blades 12. The term "mid-plane" is used interchangeably with the term "mid-plane circuit board" throughout the specification. In the embodiment shown in FIG. 3, the mid-plane 20 includes two rows of connectors 22, 24 at one face; such as, the top row of connectors 22 and the bottom row of connectors 24. Thus, each one of the slots 14 is inserted with a server blade 12 having one pair of mid-plane connectors located one above the other and each pair of mid-plane connectors mates to a pair of connectors at the one face of the mid-plane 20.

Also as shown in FIG. 3, according to this invention, the mid-plane 20 is mounted to an end of the rear module chassis 30 facing the front end of the main chassis 10. The mid-plane 20 further includes plural connectors (not shown) at an opposite face. Thus, each one of the partitions of the rear module chassis 30 is inserted with a component module 31~40 having a connector and each connector mates to a corresponding connector at the opposite face of the mid-plane 20.

Therefore, according to the aforementioned preferred embodiments, one advantage of the blade server system of the present invention is that when maintenance is needed for the mid-plane 20, the service engineer only needs to withdraw the entire rear module chassis as a whole, without the need to remove the component modules one by one, in order to gain access to the mid-plane to allow easy maintenance.

Furthermore, when maintenance is needed for any of the component modules 31~40, the identified component module may be easily removed from the mid-plane without the need to remove other component modules.

As is understood by a person skilled in the art, the foregoing preferred embodiments of the present invention are illustrated of the present invention rather than limiting of the present invention. It is intended that various modifications and similar arrangements be included within the spirit and scope of the appended claims, the scope of which should be accorded the broadest interpretation so as to encompass all such modifications and similar structure.

What is claimed is:

1. A blade server system, comprising:
   a main chassis, having a front end and a rear end, the main chassis being formed with slots into which a plurality of server blades are slidably inserted from the front end of the main chassis;
   a rear module chassis, removably mounted to the rear end of the main chassis, the rear module chassis being divided into plural partitions for housing different component modules; and
   a mid-plane circuit board, mounted to an end of the rear module chassis facing the front end of the main chassis, such that the rear module chassis and the mid-plane circuit board are simultaneously removable from the main chassis, the mid-plane circuit board including a first face and an opposite second face, the first face including plural connectors electrically connected to the server blades and the second face including plural connectors electrically connected to the component modules.

2. The blade server system according to claim 1, wherein the mid-plane circuit board is positioned approximately in the middle of the main chassis.

3. The blade server system according to claim 1, wherein the rear module chassis is slidably inserted into the rear end of the main chassis.

4. The blade server system according to claim 1, wherein the component modules include a management module.

5. The blade server system according to claim 1, wherein the component modules include a switch module.

6. The blade server system according to claim 1, wherein the component modules include a power supply module.

7. The blade server system according to claim 1, wherein the component modules include an Ethernet module.

8. The blade server system according to claim 1, wherein the component modules include a fan.

9. A rear module chassis for use with a blade server system, comprising:
   plural partitions formed at a first end of the rear module chassis for housing different component modules; and
   a mid-plane circuit board, mounted to a second end of the rear module chassis, the second end opposing the first end, the mid-plane circuit board including a first face and an opposite second face, the first face having plural connectors electrically connected to the server blades and the second face including plural connectors electrically connected to the component modules.

10. The rear module chassis according to claim 9, wherein the rear module chassis is slidably inserted into the rear end of the a main chassis.

11. The rear module chassis according to claim 9, wherein the component modules include a management module.

12. The rear module chassis according to claim 9, wherein the component modules include a switch module.

13. The rear module chassis according to claim 9, wherein the component modules include a power supply module.

14. The rear module chassis according to claim 9, wherein the component modules include an Ethernet module.

15. The rear module chassis according to claim 9, wherein the component modules include a fan.

* * * * *

UNITED STATES PATENT AND TRADEMARK OFFICE
CERTIFICATE OF CORRECTION

| | |
|---|---|
| PATENT NO. | : 7,193,847 B2 |
| APPLICATION NO. | : 11/094179 |
| DATED | : March 20, 2007 |
| INVENTOR(S) | : Yuan-Chen Liang et al. |

Page 1 of 1

It is certified that error appears in the above-identified patent and that said Letters Patent is hereby corrected as shown below:

Title page,
Item [75], should read

--Yuan-Chen Liang, Tao Yuan Shien (TW);
  Yung-Lung Liu, Pan Chiao (TW);
  Hsueh-Chin Lu, Tao Yuan Shien (TW);
  Chao-Jung Chen, Taipei (TW)--.

Signed and Sealed this

Twenty-second Day of May, 2007

JON W. DUDAS
*Director of the United States Patent and Trademark Office*